US011869580B2

(12) United States Patent
Yamagishi et al.

(10) Patent No.: US 11,869,580 B2
(45) Date of Patent: Jan. 9, 2024

(54) APPARATUSES, SYSTEMS, AND METHODS FOR COUNTER-BASED READ CLOCK IN STACKED MEMORY DEVICES

(71) Applicant: MICRON TECHNOLOGY, INC., Boise, ID (US)

(72) Inventors: Tomohiko Yamagishi, Kanagawa (JP); Seiji Narui, Kanagawa (JP); Kiyoshi Nakai, Tokyo (JP); Takamasa Suzuki, Tokyo (JP)

(73) Assignee: Micron Technology, Inc., Boise, ID (US)

(*) Notice: Subject to any disclaimer, the term of this patent is extended or adjusted under 35 U.S.C. 154(b) by 27 days.

(21) Appl. No.: 17/565,951

(22) Filed: Dec. 30, 2021

(65) Prior Publication Data

US 2023/0215494 A1 Jul. 6, 2023

(51) Int. Cl.
*G11C 11/4096* (2006.01)
*G11C 29/42* (2006.01)
*G11C 11/4074* (2006.01)
*G11C 11/4093* (2006.01)

(52) U.S. Cl.
CPC ...... *G11C 11/4096* (2013.01); *G11C 11/4074* (2013.01); *G11C 11/4093* (2013.01); *G11C 29/42* (2013.01)

(58) Field of Classification Search
CPC ............ G11C 11/4096; G11C 11/4074; G11C 11/4093; G11C 29/42
See application file for complete search history.

(56) References Cited

U.S. PATENT DOCUMENTS

| 8,565,033 | B1* | 10/2013 | Manohararajah | ........ G11C 5/04 365/233.17 |
|---|---|---|---|---|
| 2017/0358336 | A1* | 12/2017 | Shido | ....................... G06F 13/16 |
| 2018/0053545 | A1* | 2/2018 | Son | .......................... G11C 7/08 |
| 2019/0303042 | A1* | 10/2019 | Kim | ........................... G11C 5/04 |
| 2019/0304512 | A1* | 10/2019 | Narui | ..................... G11C 5/025 |
| 2023/0063588 | A1* | 3/2023 | Werhane | ............. G06F 9/30116 |
| 2023/0072895 | A1* | 3/2023 | Alzheimer | ............. G11C 29/10 |

* cited by examiner

*Primary Examiner* — Tuan T Nguyen
(74) *Attorney, Agent, or Firm* — Dorsey & Whitney LLP

(57) ABSTRACT

Apparatuses, systems, and methods for counter based read clocks in stacked memory devices. An interface die provides a read command to a core die, which reads data with timing based on the read command provides that data to a read FIFO circuit of the core die. A delay time after providing the read command, the interface die begins providing a counter-based clock signal which operates an output of the read FIFO. The counter-based clock signal operates on a different time domain (e.g., a faster frequency) than the timing of the read command.

18 Claims, 6 Drawing Sheets

APPARATUSES, SYSTEMS, AND METHODS FOR COUNTER-BASED READ CLOCK IN STACKED MEMORY DEVICES

BACKGROUND

This disclosure relates generally to semiconductor devices, such as semiconductor memory devices. A memory device may be a stacked memory device, in which a number of core dies, each containing a memory array are stacked on top of an interface die. The interface die may have terminals which connect to one or more external devices. The interface die may communicate with the core dies to perform various operations, such as read or write operations to the memory arrays in one or more of the core dies.

The core dies and interface die may be coupled by through silicon vias (TSVs). It may take time for information such as commands and/or data to propagate along the TSVs between the interface die and the core die. The interface die may provide commands and clock signals which control the timing of operations in the core dice. However, it may be important to mitigate problems caused by duty cycle distortion of clock signals over the relatively long signal paths between the interface and core dice.

DETAILED DESCRIPTION

Figure 1:
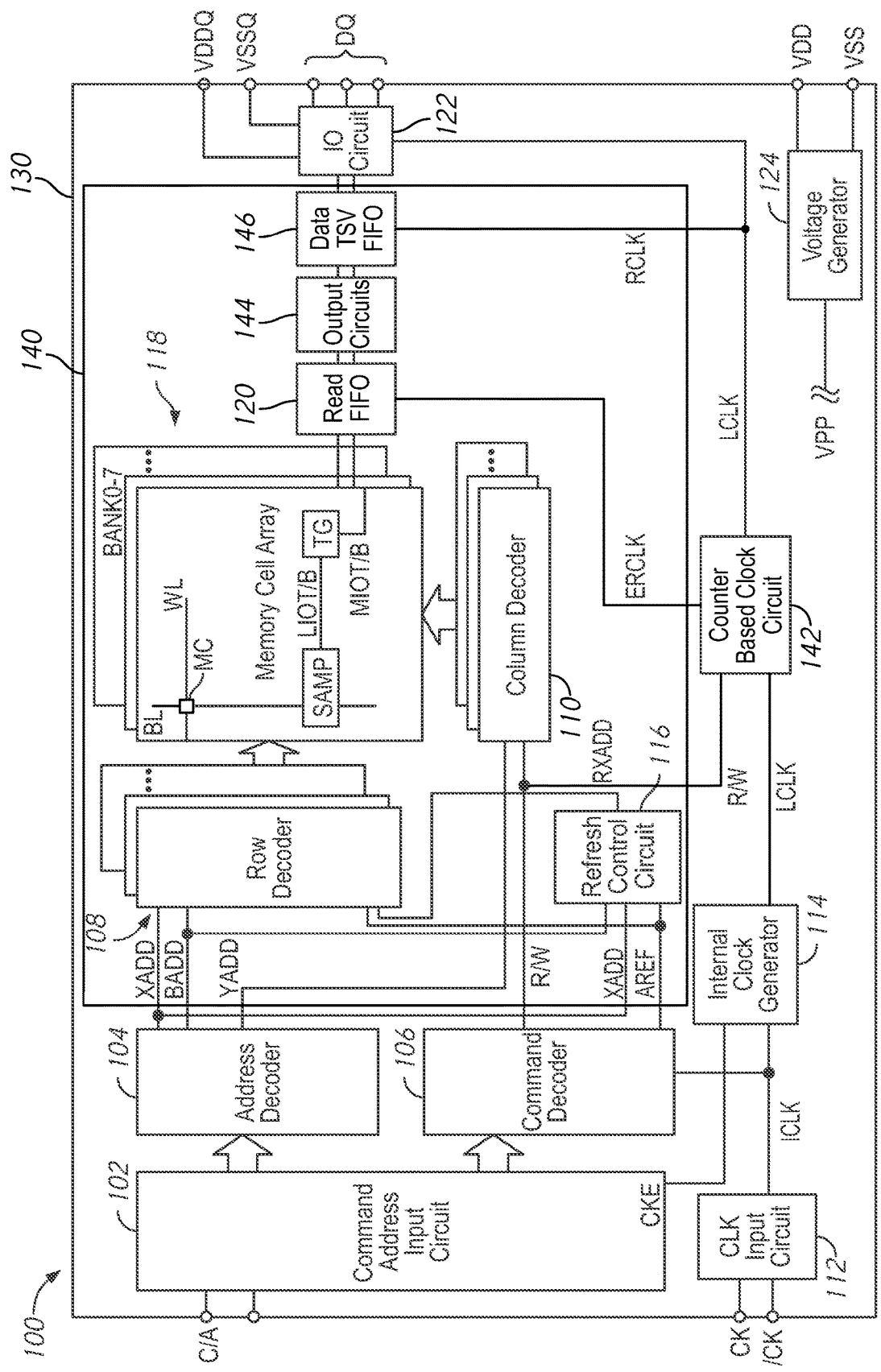
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a number of core dice, each including a memory array, stacked on an interface die, which communicates between external devices and the core dice. Each memory array has a number of memory cells, each located at the intersection of a word line (row) and digit line (column). During an access operation such as a read or write operation, the interface die may receive a command and addresses which may specify memory cell(s) in one or more of the core dice. It may be important to align the timing of the data passing between the interface and core dice so that information reaches and/or is received from) a given core die with predictable timing.

Various signals may be used to control the timing at which operations are performed. For example, in a read operation, a first timing signal, such as a read command may be passed from the interface die to the core die (e.g., along through silicon vias or TSVs). The read command may include timing information which causes the array to provide data in a first timing domain. The data is passed to a serializer, which operates based on a second timing signal (e.g., a clock signal) which operates in a second timing domain, which may be faster than the first timing domain. For example, a read FIFO may act as the serializer, and may load data (e.g., have an input pointer) which operates on the first timing domain and may provide data (e.g., have an output pointer) which operates on the second timing domain. Problems may arise if the second timing signal is provided along with the first timing signal. For example, if the second timing signal is provided along with the first timing signal, it may need to follow a particularly long path between the interface die and the read FIFO, passing through a replica delay circuits to replicate the delay that the first timing signal goes through as it operates the memory array. This may lead to problems as the second timing signal may become distorted relative to the first timing signal. For example, the second timing signal may have duty cycle distortion, which may cause problems with the data window.

The present disclosure is drawn to apparatuses, systems, and methods for counter-based read clock in stacked memory device. The interface die provides a first timing signal, such as a read command, starting at a first time, and then at a second time after the first time, begins providing a counter-based read clock. The counter-based read clock is passed to a read FIFO of the interface die. Since the counter-based read clock is generated at a second time and then provided to the read FIFO, it may simplify the path that the counter-based read clock takes, which in turn may reduce the chance of distortion of the counter-based read clock. For example, the delay before the counter-based read clock is provided (e.g, the delay between the first time and the second time) may ensure that the counter-based read clock is synched with the first timing signal (e.g., a read command) without the need for the counter-based read clock to pass through a replica delay.

In an example implementation, the interface die provides a read command at a first time. The read command acts as the first timing signal, and may operate in a tCCDS domain which is shared between the bank groups. An internal read command specific to each bank group operates the associated bank to provide data with timing based on the tCCDL domain to a read FIFO. A read latency counter of the interface die begins counting a clock signal CK, such as a system clock, beginning at the first time. After the count reaches a number, the read latency counter begins providing a counter-based read clock ERCLK which operates on a tCCDS time domain, which is faster (e.g., twice the frequency) of the tCCDL time domain. The read latency counter may generate the ERCLK based on an external clock signal. The interface die provides ERCLK to the read FIFO, where an output pointer is operated based on the ERCLK signal. A data TSV FIFO of the core die then provides the data from the read FIFO using the read clock RCLK to control timing, FIG. 1 is a block diagram of a semiconductor device according an embodiment of the disclosure. The semiconductor device 100 may be a semiconductor memory device, such as a DRAM device. The DRAM device may include an interface die and a plurality of core dice which are stacked on the interface die. In the example diagram of FIG. 1, certain components are shown located on an interface die 130, while other components are shown as part of each of the core dice 140. For the sake of clarity, only a single core die 140 and its components are shown, however, there may be multiple core die (e.g., 2, 4, 6, 8, 16, or more) each with similar components to each other. The example device 100 of FIG. 1 shows a particular arrangement of components between the interface die 130 and core die 140, however other arrangements may be used in other embodiments (e.g., the refresh control circuit 116 may be on the interface die 130 in some embodiments). For the sake of illustration, the core die 140 is drawn as a box which is smaller than the interface die 130, however the core die 140 and interface 130 may have any size relationship to each other. For example, the core die and interface die may be approximately the same size.

Figure 2:
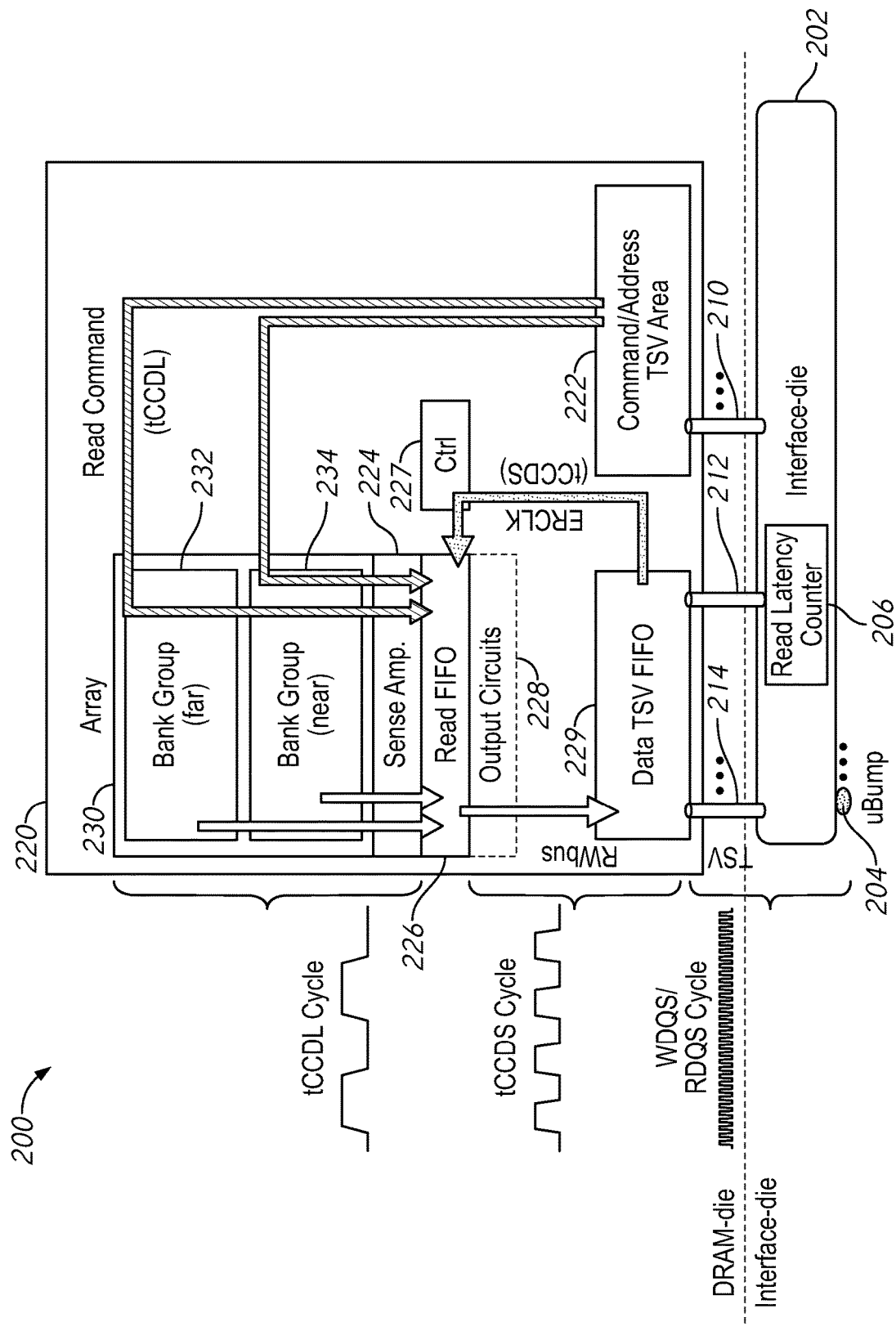
FIG. 2 is a block diagram of a memory device according to some embodiments of the present disclosure.

The semiconductor device 100 includes a memory array 118 on each of the core dice 140. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110, each of which may also be located on each of the core dice. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) of the memory array 118. Read data from the bit line BL is amplified by the sense amplifier SAMP, and transferred to a read FIFO 120 over complementary local data lines (LIOT/B), transfer gate (TG), and complementary main data lines (MIOT/B). Conversely, write data is transferred to the sense amplifier SAMP over the complementary main data lines MIOT/B, the transfer gate TG, and the complementary local data lines LIOT/B, and written in the memory cell MC coupled to the bit line BL. In some embodiments, the sense amplifiers SAMP may be used to amplify signals along the MIOT/B lines (e.g., instead of, or in addition to, the LIOT/B lines as shown in FIG. 1). FIG. 2 shows an example embodiment with different sense amplifier placement in more detail.

The semiconductor device 100 may employ a plurality of external terminals located on the interface die 130 that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals on the interface die 130 are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. For example, the internal data clocks LCLK may include a read clock ICLK used as part of read operations.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The interface die 130 includes a counter based clock circuit 142, which generates a counter-based read clock ERCLK. When a read command is generated by the command decoder 106, the counter based clock circuit 142 begins counting a number of activations of a clock signal. When the count reaches a specified value (e.g., a specified amount of time after the read command was provided), the counter based clock circuit 142 begins providing the counter-based read clock ERCLK. The counter based clock circuit 142 may generate ERCLK with timing based on one or more external clocks CK and/or /CK, one of the internal clock signals ICLK and/or LCLK, or combinations thereof. The clock ERCLK is provided to a read FIFO.

During an example read operation, the device 100 may receive an access command which is a read command. When a read command is received, and a bank address, a row address and a column address are timely supplied with the read command, read data is read from memory cells in the memory array 118 corresponding to the row address and column address with timing governed by the read command, which is part of a first clock domain. The read command is received by the command decoder 106, which provides internal commands so that read data from the memory array 118 is provided to the read FIFO 120. The read FIFO 120 loads the data (e.g., operates an input pointer) with timing based on the first clock domain (e.g., based on the read command). The read FIFO 120 outputs the data with timing based on ERCLK (e.g., an output pointer of the read FIFO operates based on ERCLK). The data may pass through one or more optional output circuits 144, such as an error correction code ECC circuit and/or data bus inversion DBI circuit to a data TSV FIFO 146. In some embodiments, the output circuits 144 are omitted, and the read FIFO 120 provides the data to the data TSV FIFO 146. The read data is provided by the data. TSV FIFO 146 to an I/O circuit 122 of the interface die, which then provides the read data to data terminals DQ of the interface die 140. The data TSV FIFO 146 operates with timing based on the read clock RCLK. In some embodiments, the counter based clock circuit 142 may also provide the read clock RCLK. In some embodiments, the clock ERCLK may be provided a first delay time after the read command is received and may begin providing the read clock RCLK may be provided a second delay time after the ERCLK is provided. The two delay times may be settings, such as mode register settings.

The device 100 may receive an access command which is a write command. When the write command is received, and a bank address, a row address and a column address are timely supplied with the write command, and write data is supplied through the DQ terminals to the core die 130. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122.

The device 100 may also receive commands causing it to carry out one or more refresh operations as part of a self-refresh mode. In sonic embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116, The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials such as VCCP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

FIG. 2 is a block diagram of a memory device according to some embodiments of the present disclosure. The memory device 200 may, in some embodiments, be included in the memory device 100 of FIG. 1. FIG. 2 shows a view of a memory device 200 which focuses on components and signals relevant to the timing of a read path. Other signals and components are omitted from the view of FIG. 2.

The memory 200 includes an interface die 202 (e.g., 130 of FIG. 1) and one or more core dice 220 (e.g., 140 of FIG. 1) stacked on top of the interface die 202. The interface die 202 includes a number of external connections such as micro bumps (uBumps) 204. The external connections 204 send and receive signals such as clock signals, data, command, addresses, etc. For the sake of brevity, only a single core die 220 is shown, however the memory 200 may have several core dice (e.g., 2, 4, 6, 8, more or fewer) stacked on the interface die 202. The core die 220 represents a core die selected as part of a current read operation.

The interface die provides read commands along a through silicon via (TSV) 210 to a command/address TSV area 222 of the core die 220. Different banks of the memory array 230 may receive different read commands (and read clocks). For example, each bank group of the array 230 may receive its own read command. The command/address TSV area is coupled to a set of TSVs, such as TSV 210, which convey commands and addresses between the interface die 202 and the core die 220. The command/address TSV area may include a command/address input circuit (e.g., 102) which routes commands and addresses to different components of the core die.

The read command is provided to a memory array 230 (e.g., 118 of FIG. 1), through a command decoder (not shown). The read command includes timing information which indicates a timing at which the memory array 230 should be operated as part of the read operation. For example, the read command may include a timing signal such as a clock signal. The read command may operate in a tCCDL timing domain. The tCCDL timing domain has a first frequency, which may be relatively slow compared to other timing domains of the memory 200.

The array 230 includes a number of memory banks, here represented as far bank groups 232 and near bank groups 234. These banks are grouped based on their proximity to output circuitry such as the read FIFO 226. Different banks may have different distances from the read FIFO 226, however for the sake of brevity only a generic near and far bank group are shown. The different bank groups 232 and 234 are shown to represent that data from different banks may take different amounts of time to arrive at the sense amplifiers 224 and read FIFO 226. For example, data from the far bank group 232 may take longer than data from the near bank group 234 to arrive.

Responsive to the read command (e.g., with timing in the tCCDL domain) the array 230 provides data to the sense amplifiers 224. The sense amplifiers 224 may include a set of sense amplifiers associated with the far bank group 232 and a set of sense amplifiers associated with the near bank group 234. Although only a single block of sense amplifiers 224 is shown, in some embodiments, the sense amplifiers may be distributed such that, for example, a set associated with the far bank group 232 is close to the far bank group 232. The sense amplifiers 224 determine a level of voltage along a bit line coupled to memory cell(s) along an active word line, and amplify that voltage. That voltage is provided out along input/output lines to a read FIFO 226. The read FIFO 226 receives and stores the data with timing based on the read command (e.g., in the tCCDL domain). For example, the read FIFO 226 may have an input pointer which operates with timing based on the tCCDL domain.

The interface die 202 includes a read latency counter 206 (e.g., a counter-based clock circuit, such as 142 of FIG. 1). Responsive to the read command being provided by the interface die 202 to the command address TSV area 222, the read latency counter begins counting an amount of time and provides ERCLK after that amount of time has passed. For example, the read latency counter may begin counting a number of clock cycles, such as a number of cycles of a clock, such as a system clock CK. When the counter reaches a threshold, it may indicate that the prescribed amount of time has passed. The amount of time may be part specific, and may indicate a latency between when the read command is issued and when the data is loaded in the read FIFO 226 responsive to that read command. For example, the threshold that the counter reaches (e.g., the amount of time) may be based on a setting of the memory 200, such as a mode register setting. In some embodiments, the read latency counter 206 may also provide a read clock RCLK. In some embodiments, separate thresholds may be set for the timing before ERCLK is provided and the timing before RCLK is provided. In some embodiments, the two thresholds may be linked (e.g., a first threshold is set for ERCLK and a second threshold to provide RCLK is set for a delay time after ERCLK is provided).

When the prescribed amount of time has passed (e.g., when the count reaches a threshold value), the read latency counter begins providing a counter-based read clock ERCLK. The clock ERCLK operates on a time domain different than the read command. For example, the ERCLK may operate on a tCCDS time domain different than the tCCDL time domain. The ERCLK may have a faster frequency than a frequency of the timing signal in the read command. For example, the tCCDS signal may have twice the frequency of the tCCDL signal. The interface die 202 may generate the ERCLK signal based on an external clock signal (e.g., received at one of the uBumps 204). For example, ERCLK may be generated based on a system dock such as CK or /CK.

The interface die 202 provides the signal ERCLK along one or more TSVs 212 to the core die 220. A data TSV FIFO 229 of the core die 220 receives ERCLK and provides it to a control circuit 227 of the read FIFO 226. The signal ERCLK may follow a shorter signal transmission path than the read command. The control circuit 227 operates an output pointer of the read FIFO 226 with timing based on ERCLK. Accordingly, data may enter the read FIFO 226 with timing based on the tCCDL domain (e.g., the read command) and leave with timing based on the faster tCCDS domain (e.g., ERCLK).

The core die 220 may include optional output circuits 228. The output circuits 228 operate with timing based on the ERCLK signal (e.g., in the tCCDS cycle). The optional output circuits 228 may perform processing steps on the data before it is provided off the core die 220. For example, the output circuit 228 may include an ECC circuit and/or a DBI circuit. The ECC circuit may check the read data for errors and correct one or more bits of detected errors. For example, the read data from the array 230 may include some number of parity bits, generated by the FCC circuit when the data was written to the array, and used to locate errors when the data is read out. The DBI circuit may be used to encode data in a manner which requires fewer signal transitions (which draw power). For example, the DBI circuit may compare current data to previous data, and then encode whether a signal transition is required or not (e.g., if the current data is different than the previous data).

The read FIFO 226 provides the read data to the data TSV FIFO 229 (optionally through output circuits 228). The data TSV FIFO stores the data and provides it along one or more TSVs 214 to the interface die 202 (where the data can be provided along the uBumps 204 to external devices). Analogous to the two timing domains of the read FIFO 226, the data TSV FIFO 229 receives data with timing based on the ERCLK signal (e.g., in the tCCDS domain) and provides data with timing based on a read clock which operates in a different timing domain such as write and read data domains WDQS and RDQS. The write and read data domains may have a faster frequency than the tCCDS (and tCCDL) domains.

Figure 3:
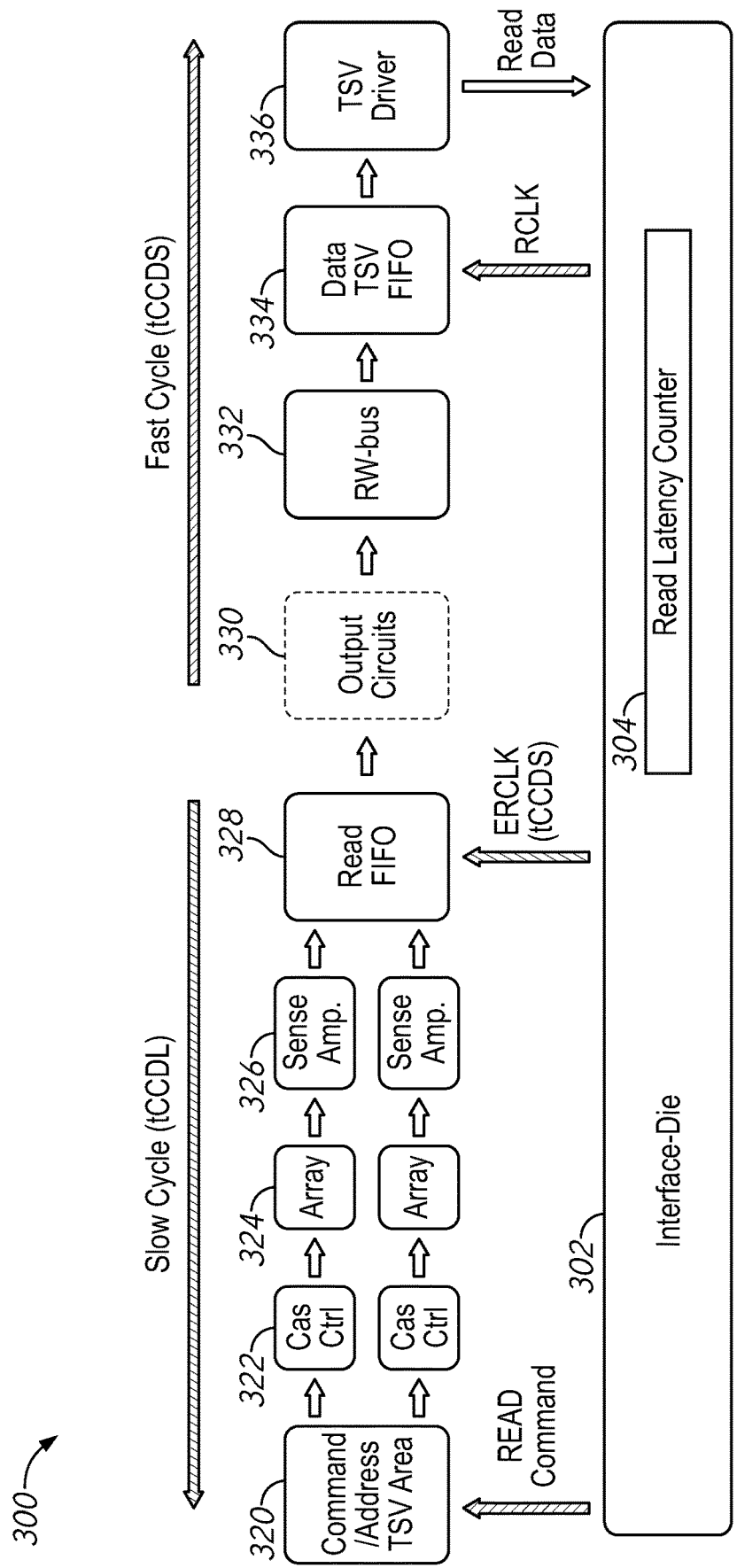
FIG. 3 is a block diagram of a read path in a memory device according to some embodiments of the present disclosure.

FIG. 3 is a block diagram of a read path in a memory device according to some embodiments of the present disclosure. The read path 300 may, in some embodiments, represent the operation of one or more of the memory devices 100 and/or 200 of FIGS. 1-2. The components of FIG. 3 may generally be analogous to those described with respect to FIG. 2.

The read path 300 includes an interface die 302 (e.g., 130 of FIG. 1 and/or 202 of FIG. 2), as well as a number of components 320-336 which are part of a core die (e.g., 140 of FIG. 1 and/or 220 of FIG. 2). The interface die 302 provides a read command to a command/address TSV area 320 (e.g., 222 of FIG. 2) of the core die. The read command includes a timing signal in the tCCDL domain. The command/address TSV area 320 provides signals to a CAS control circuits 322. The CAS control circuits 322 may be part of a column decoder (e.g., 110 of FIG. 1) and may control a timing at which data is read from a memory array. For example, the CAS control circuits 322 may activate bit lines of the memory array 324. The activated bit lines provide data (from memory cells at the intersection of an active row) to sense amplifiers 326, which provide the data to a read FIFO 328. The components, such as the CAS control 322, array 324, and sense amplifiers 326 are represented as "doubled up" in the diagram, because multiple ones of those components may be activated in parallel. The parallel lines of doubled up components may represent components associated with different bank groups. For example, two CAS control circuits 322 may each activate a bit line in the memory array 324, one in a first bank group (e.g., 232 of FIG. 2) and one in a second bank group. (e.g., 234 of FIG. 2). The activated bit lines may read out two bits to respective sense amplifiers 326 (each of which may be in a set of sense amplifiers associated with that bank group), each of which may provide a bit to the read FIFO 328. The read FIFO 328 stores (e.g., with an input pointer) the data using the read command for timing (e.g., in a tCCDL clock domain).

The interface die 302 includes a read latency counter 304 which provides a counter based read clock ERCLK a set time after the read command is provided. For example, the read latency counter 304 may count a number of cycles of a clock signal (e.g., a CK clock) and begin providing ERCLK when the count reaches a threshold. The ERCLK signal may be a different timing domain than the read command. For example, the ERCLK may be part of a tCCDS clock domain which has a higher frequency than the tCCDL domain. For example, ERCLK may have double the frequency of the timing signal of the read command.

The read FIFO 328 has an output pointer which operates with timing based on the ERCLK. Since in the example embodiment ERCLK has twice the frequency of the read command, the read FIFO 328 may act to serialize the data received in parallel from the two sense amplifiers 326 and provide two bits in series. The series bits are provided through an optional output circuit 330, such as a DBI or ECC circuit to a read/write (RW) bus 332, which provides the serial data to the data TSV FIFO 334. The output circuit 330, RW bus, and input of the data TSV FIFO 334 may operate with timing in the tCCDS domain. The data TSV FIFO uses the clock signal RCLK to provide the data to a TSV driver 336 which provides the data back to the interface die 302.

Figure 4:
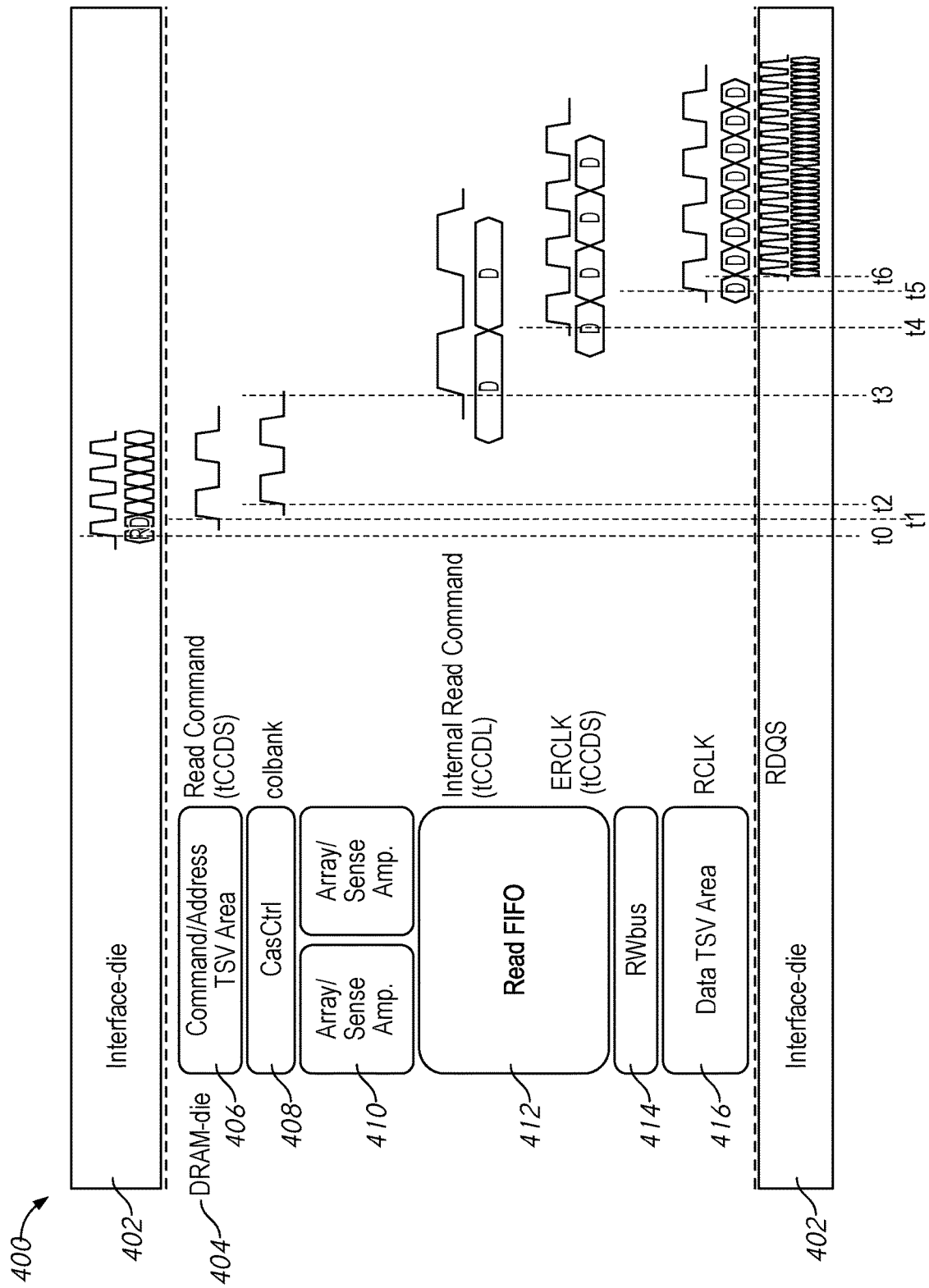
FIG. 4 is a timing diagram of an example read operations according to some embodiments of the present disclosure.

FIG. 4 is a timing diagram of an example read operations according to some embodiments of the present disclosure. The timing diagram 400 may, in some embodiments, be implemented by one or more of the memory devices 100-300 of FIGS. 1-3. The components of the memory may generally be analogous to those previous described with respect to FIGS. 2 and 3.

At an initial time t0, an interface die provides a read command with timing based on an external clock signal CK. At a first time t1, a command/address TSV area 406 of the core die 404 receives the read command as clock signal with timing based on the read command provided by the interface die 404. At a time t2, the CAS control circuit 408 provides a column activation signal with timing based on the read command. The column activation signal activates the array 410, which generates data and provides it to the sense amplifiers.

At a time t3, a timing signal based on the read command (e.g., in the tCCDL time domain) is used to load data (D) in the read FIFO 412. The data is read out from the read FIFO 412 in a different clock domain (tCCDS), managed by a clock signal ERCLK is used to retrieve data from the read FIFO. The counter based clock signal ERCLK is provided by the interface die 402. The data is passed through a RW bus 414 to a data TSV area 416 at a time t5. At a time t6, a read clock signal in a third time domain (e.g., RDQS) is used to provide the data onto the interface die 402.

Figure 5:
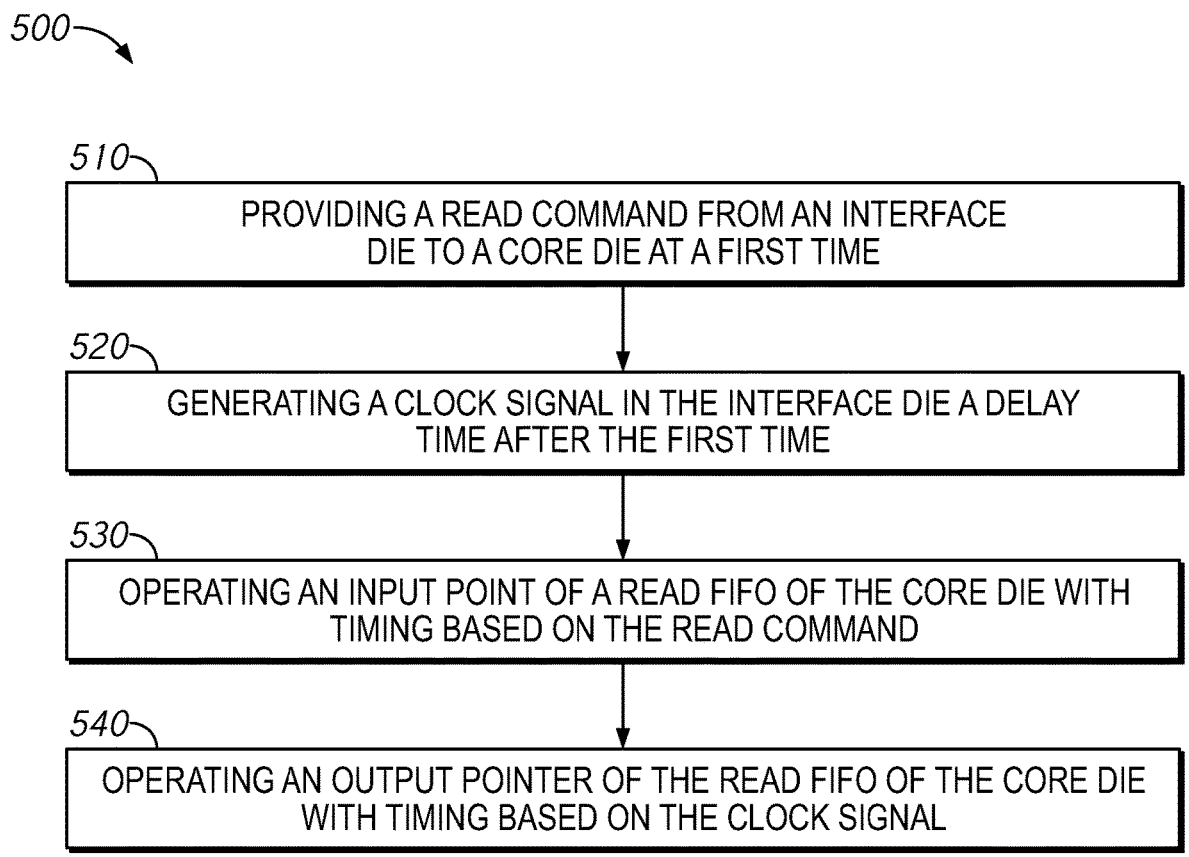
FIG. 5 is a flow chart of a method according to some embodiments of the present disclosure.

FIG. 5 is a flow chart of a method according to some embodiments of the present disclosure. The method 500 may, in some embodiments, be implemented by one or more of the apparatuses and/or systems of any of FIGS. 1-4.

The method 500 includes box 510, which describes providing a read command from an interface die to core die at a first time. The read command may be received from an external device such as a controller, along external terminals, such as uBumps 204 of FIG. 2. The read command may include timing information such as a timing signal, which may be in a tCCDL domain. The method 500 may include providing the read command along TSVs (e.g., 210 of FIG. 2) to a command address TSV area (e.g., 222) of a core die.

The method 500 may include reading data (e.g., by activating bit lines) from a memory array with timing based on the read command (e.g., in the tCCDL domain).

The method 500 includes box 520, which describes generating a clock signal (e.g., ERCLK) in the interface die a delay time after the first time. For example, the method 500 may include counting a number of clock cycles of a system clock, such as a CK clock, starting at the first time, and providing the clock signal when the number reaches a threshold. The method 500 may include generating the clock signal based on an external clock signal (e.g., CK of FIG. 1). The method 500 may include generating the clock signal with a time domain (e.g., frequency) different than the time domain of the read command, example, the method 500 may include receiving a read command with a tCCDL time domain and generating a clock signal with a tCCDS time domain. The method 500 may include providing the clock signal through a data TSV (e.g., 214 of FIG. 2) to a data TSV FIFO (e.g., 229 of FIG. 2) of the core die 220).

The method 500 includes box 530, which describes operating an input pointer of a read FIFO (e.g., 120 of FIG. 1) of the core die with timing based on the read command. For example, the method may include loading data from the memory array into the read FIFO with timing based on the read command (e.g., in the tCCDL domain).

The method 500 includes box 540, which describes operating an output pointer of the read FIFO with timing based on the clock signal. The method 500 may include retrieving data from the read FIFO with timing in the tCCDS domain. The method 500 may include serializing parallel data received by the read FIFO. The method 500 may include outputting data through a data TSV FIFO with timing based on a read clock signal (e.g., a RDQS domain).

Figure 6:
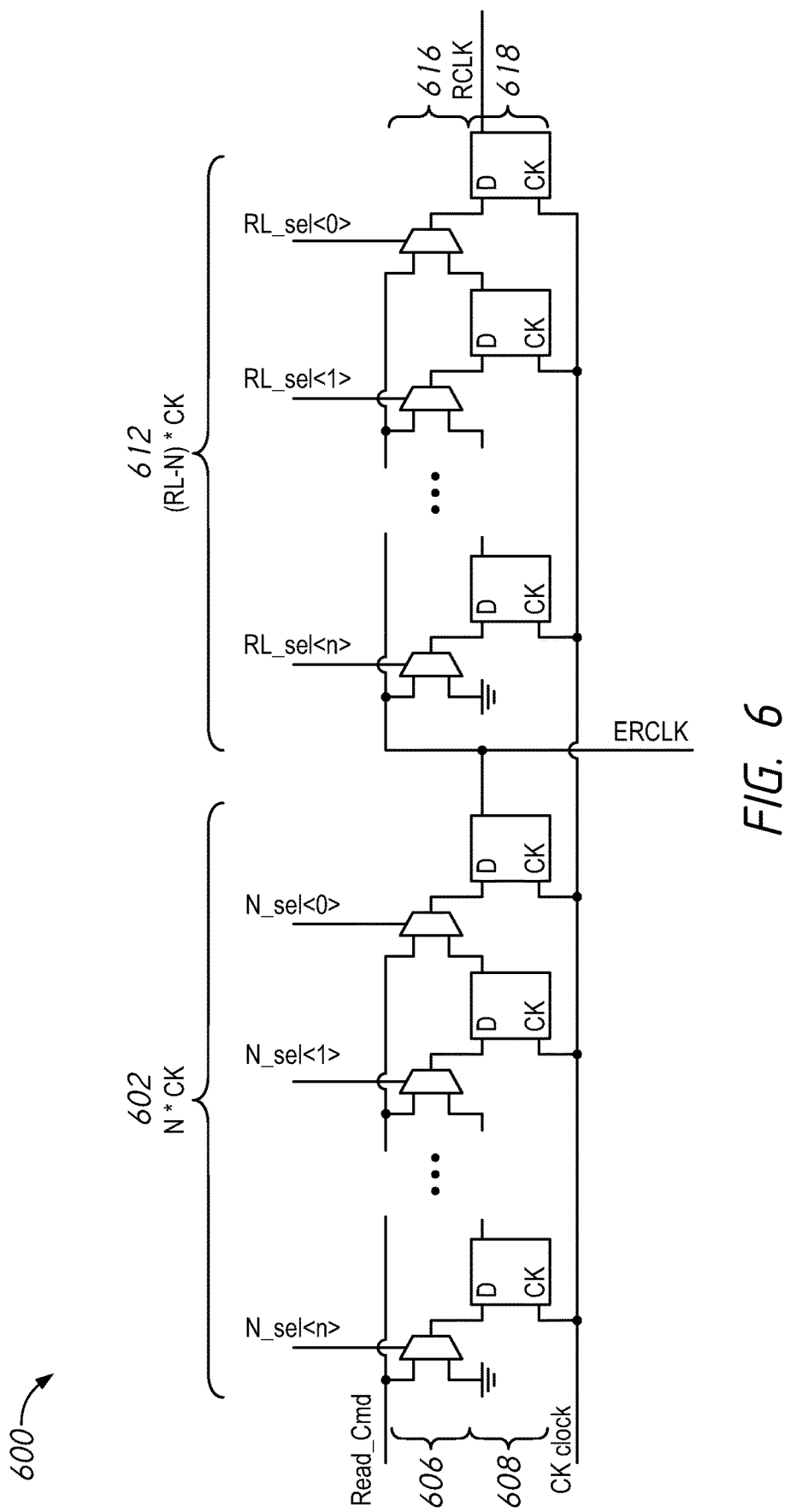
FIG. 6 is a block diagram of a counter based clock circuit according to some embodiments of the present disclosure.

FIG. 6 is a block diagram of a counter based clock circuit according to sonic embodiments of the present disclosure. The counter based clock circuit 600 may, in some embodiments, be an implementation of the counter based clock circuit and/or read latency counter 142 of FIG. 1, 206 of FIG. 2, 304 of FIG. 3, and/or 412 of FIG. 4.

The counter based clock circuit includes a first counter circuit 602 and a second counter circuit 612. The first counter circuit 602 provides the clock signal ERCLK based on a read command Read_Cmd and a system clock CK. The second counter circuit 612 provides the clock signal RCLK based on the clock ERCLK and the system clock CK. The two counter circuits 602 and 612 generate ERCLK and RCLK and may act as a common read latency counter for the two clocks.

The first counter circuit 602 has a first threshold value, and the clock ERCLK is provided when a number of times that a system clock CK is received after a read command Read_Cmd reaches that first threshold. Similarly, the second counter circuit 612 has a second threshold value, and the clock RCLk is provided when a number of times that the clock CK is received after ERCLK begins being provided reaches the second threshold value. The first and the second threshold values may be based settings of the memory, such as mode register settings. The first threshold may be expressed as N*CK, where N is a selected cycle count for the ERCLK delay. The second threshold may be expressed as (RL N)*CK where RL is a selected cycle count for the RCLK delay and N is the cycle count for the ERCLK delay. For example, after the read command Read_Cmd is received, the first counter circuit counts N times that CK is provided, and then begins providing ERCLK.

Each counter circuit 602 and 612 may be broadly similar. For the sake of brevity, only the counter circuit 602 is described in detail herein. The counter circuit 602 includes a set of multiplexers 606 and a set of latches 608. Each multiplexer 606 provides either the read command or a signal stored in a previous latch 608, except for a first multiplexer which provides either the read command Read_Cmd or a logical low value (e.g., a ground voltage). Each latch stores a value from an associated one of the multiplexers (e.g., the output of the multiplexer is coupled to a data terminal D) with timing based on the clock signal CK (e.g., the clock signal is coupled to a clock terminal CK). Each latch 608 provides the stored value to a next multiplexer 606. The final latch 608 provides the signal ERCLK. Each multiplexer is coupled to a respective bit of an threshold selecting signal N_sel. In this manner, how many bits of N_sel are active determines how many latches 608 are coupled in series through the multiplexers 608 as part of a shift register. The number of active bits of N_sel determines the value N of the threshold, since the signal Read_cmd will need to pass through that many latches 608 (one for each tick of CK) before emerging from the final latch as ERCLK.

In an analogous fashion, the second counter circuit 612 includes multiplexers 616 and latches 618. Here each multiplexer is coupled either to ERCLK or to a previous latch 618, and the final latch 618 provides the signal RCLK. The multiplexers 616 are coupled to a signal RL_sel, which is a multibit signal which determines how many latches 618 are coupled together as a shift register.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   an interface die configured to provide a read command at a first time, the interface die comprising a counter based clock circuit configured to provide a counter-based read dock a delay time after the read command is provided, wherein the read command includes a timing signal which has a first frequency and the counter-based read clock has a second frequency different than the first frequency; and
   a core die comprising:
      a memory array configured to provide data with timing based on the read command;
      a read FIFO with an input pointer configured to operate with timing based on the read command and an output pointer configured to operate with timing based on the counter-based read clock.

2. The apparatus of claim 1, wherein the counter based clock circuit counts a number of cycles of a clock and provides the counter-based read clock when the count reaches a threshold.

3. The apparatus of claim 1, wherein the core die further comprises a data through silicon via (TSV) FIFO configured to operate with timing based on read clock received from the interface die.

4. The apparatus of claim 1, wherein the counter-based read clock is received through the data TSV FIFO, and wherein the read command is received through a command/address TSV area of the core die.

5. The apparatus of claim 1, wherein the core die further comprises an output circuit including an error code correction (ECC) circuit, a data bus inversion (DBI), or combinations thereof, and wherein the output circuit operates on the counter-based read clock.

6. The apparatus of claim 1, wherein the memory array is configured to provide data in parallel and wherein the read FIFO is configured to serialize the data.

7. An apparatus comprising:
   a command address through silicon via (TSV) configured to receive a read command from an interface die, wherein the read command includes a timing signal which has a first frequency;
   a data TSV configured to receive a counter-based read clock from the interface die, wherein the counter-based read clock has a second frequency different than the first frequency;
   a memory array configured to provide data responsive to the read command;
   a read FIFO configured to store data with timing based on the read command; and
   a control circuit configured to operate an output pointer of the read FIFO with timing based on the counter-based read clock.

8. The apparatus of claim 7, wherein the interface die includes a counter configured to provide the counter-based read clock a delay time after the interface die provides the read command.

9. The apparatus of claim 8, wherein the counter is configured to count a number of cycles of a clock and wherein the counter-based read clock is provided when the count reaches a threshold.

10. An apparatus comprising:
    a command address through silicon via (TSV) configured to receive a read command from an interface die, wherein the read command is in a tCCDL time domain;
    a data ISV configured to receive a counter-based read clock from the interface die, wherein the counter-based read clock is in a tCCDS time domain;
    a memory array configured to provide data responsive to the read command;
    a read FIFO configured to store data with timing based on the read command; and
    a control circuit configured to operate an output pointer of the read FIFO with timing based on the counter-based read clock.

11. The apparatus of claim 10, wherein the data TSV provides data to the interface die with timing based on a RDQS time domain.

12. The apparatus of claim 7, further comprising an output circuit which includes a data bus inversion (DBI) circuit, an error code correction (ECC) circuit; or combinations thereof.

13. The apparatus of claim 7, wherein the read FIFO is configured to serialize parallel data received from the memory array.

14. A method comprising:
    providing a read command from an interface die to a core die at a first time;

generating a clock signal in the interface die a delay time after the first time, wherein the clock signal is generated with a separate timing domain than a timing domain of the read command;

operating an input pointer of a read FIFO of the core die with timing based on the read command; and operating an output pointer of the read FIFO with timing based on the clock signal.

15. The method of claim 14, further comprising:

receiving the read command at a command/address TSV area of the core die; and receiving the clock signal at a data TSV of the core die.

16. The method of claim 14, further comprising:

counting a number of activations of a clock with a read latency counter of the interface die; and providing the clock signal when the count reaches a threshold.

17. The method of claim 14, further comprising generating the clock signal based on an external clock received at the interface die.

18. The method of claim 14, further comprising reading data from a memory array with timing based on the read command.

\* \* \* \* \*

UNITED STATES PATENT AND TRADEMARK OFFICE
CERTIFICATE OF CORRECTION

PATENT NO. : 11,869,580 B2
APPLICATION NO. : 17/565951
DATED : January 9, 2024
INVENTOR(S) : Tomohiko Yamagishi et al.

It is certified that error appears in the above-identified patent and that said Letters Patent is hereby corrected as shown below:

In the Claims

|  | Reads | Should Read |
|---|---|---|
| Column 11, Line 52 Claim 1, | "configured to provide a counter-based read dock" | --configured to provide a counter-based read clock-- |
| Column 12, Line 45 Claim 10, | "a data ISV configured to receive" | --a data TSV configured to receive-- |

Signed and Sealed this
Second Day of April, 2024

Katherine Kelly Vidal
*Director of the United States Patent and Trademark Office*